(12) United States Patent
Shindo et al.

(10) Patent No.: US 7,777,334 B2
(45) Date of Patent: Aug. 17, 2010

(54) SEMICONDUCTOR DEVICE HAVING ACTIVE ELEMENT FORMATION REGION PROVIDED UNDER A BUMP PAD

(75) Inventors: Akinori Shindo, Hokuto (JP); Masatoshi Tagaki, Suwa (JP); Hideaki Kurita, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/070,320

(22) Filed: Feb. 15, 2008

(65) Prior Publication Data
US 2008/0142906 A1 Jun. 19, 2008

Related U.S. Application Data

(62) Division of application No. 11/478,485, filed on Jun. 29, 2006, now abandoned.

(30) Foreign Application Priority Data

Jul. 6, 2005 (JP) ............... 2005-197927
Mar. 17, 2006 (JP) ............... 2006-074732

(51) Int. Cl.
*H01L 23/485* (2006.01)
(52) U.S. Cl. .............. 257/737; 257/758; 257/773; 257/786; 257/E23.02; 257/E23.021
(58) Field of Classification Search ............. 257/737, 257/738, 750–766, 773–776, 780–784, E23.019–E23.022, 257/786
See application file for complete search history.

(56) References Cited

U.S. PATENT DOCUMENTS

| 5,084,752 A | 1/1992 | Satoh et al. |
| 6,130,485 A | 10/2000 | Hirai |
| 6,268,642 B1 | 7/2001 | Hsuan et al. |
| 6,441,467 B2 * | 8/2002 | Toyosawa et al. ........... 257/637 |
| 6,465,895 B1 | 10/2002 | Park et al. |
| 6,538,326 B2 | 3/2003 | Shimizu et al. |
| 6,650,002 B1 | 11/2003 | Toyosawa et al. |
| 6,781,238 B2 | 8/2004 | Nonaka |
| 6,864,562 B1 | 3/2005 | Toyosawa et al. |
| 7,064,417 B2 | 6/2006 | Arai |

(Continued)

FOREIGN PATENT DOCUMENTS

CN          1601735          9/2004

(Continued)

*Primary Examiner*—Marcos D. Pizarro
(74) *Attorney, Agent, or Firm*—Harness, Dickey & Pierce, P.L.C.

(57) ABSTRACT

A semiconductor device comprising: a semiconductor layer including an element formation region, and first and second spaced apart isolation regions; an element in the element formation region; an interlayer dielectric layer above the semiconductor layer; an electrode pad above the interlayer dielectric layer; a passivation layer above the electrode pad and having an opening which exposes part of the electrode pad; and a bump in the opening and covering part of the element when viewed from a top side, the bump including a first edge when viewed from the top side, the first isolation region being formed in a first region, the first region including a first specific distance outward from a first line directly below the first edge of the bump, the second isolation region being formed in a second region, the second region including a second specific distance inward from the first line.

5 Claims, 3 Drawing Sheets

U.S. PATENT DOCUMENTS

| | | |
|---|---|---|
| 7,271,046 B2 | 9/2007 | Arai |
| 7,312,530 B2 | 12/2007 | Hashimoto et al. |
| 2005/0112825 A1 | 5/2005 | Kasuya |
| 2007/0007599 A1 | 1/2007 | Shindo et al. |
| 2007/0007662 A1 | 1/2007 | Shindo et al. |
| 2008/0284026 A1 | 11/2008 | Hashimoto et al. |

FOREIGN PATENT DOCUMENTS

| | | |
|---|---|---|
| EP | 0-973-198 A2 | 7/1999 |
| JP | 02-024540 | 2/1990 |
| JP | 03-073438 | 7/1991 |
| JP | 2535529 | 2/1997 |
| JP | 11-008247 | 1/1999 |
| JP | 11-126790 | 5/1999 |
| JP | 11-145199 | 5/1999 |
| JP | 2000-49190 A | 2/2000 |
| JP | 2000-058549 | 2/2000 |
| JP | 2001-110833 | 4/2001 |
| JP | 2001-284537 | 10/2001 |
| JP | 2002-319587 | 10/2002 |
| JP | 2003-297865 | 10/2003 |
| JP | 2003-347333 | 12/2003 |
| JP | 2004-207509 | 7/2004 |
| JP | 3608393 | 10/2004 |
| JP | 2004-363173 | 12/2004 |
| JP | 2004-363224 | 12/2004 |
| JP | 2005-050963 | 2/2005 |
| KR | 1997-0077390 | 12/1997 |
| KR | 1999-0052264 | 7/1999 |
| KR | 1999-0070614 | 9/1999 |
| KR | 10/0302536 | 7/2001 |
| KR | 2001-0061082 | 7/2001 |
| KR | 2002-0030258 | 4/2002 |
| KR | 10-0419813 | 2/2004 |
| KR | 2004-0032974 | 4/2004 |
| KR | 2007-0005498 | 1/2007 |
| KR | 2007-0005521 | 1/2007 |

* cited by examiner

SEMICONDUCTOR DEVICE HAVING ACTIVE ELEMENT FORMATION REGION PROVIDED UNDER A BUMP PAD

This application is a divisional of U.S. patent application Ser. No. 11/478,485 filed on Jun. 29, 2006. This application claims the benefit of Japanese Patent Application No. 2005-197927, filed on Jul. 6, 2005, and Japanese Patent Application No. 2006-74732, filed on Mar. 17, 2006. The disclosures of the above applications are incorporated herein by reference.

BACKGROUND OF THE INVENTION

The present invention relates to a semiconductor device.

In related-art technology, when disposing a semiconductor element such as a MOS transistor under a pad, the characteristics of the semiconductor element may be impaired due to stress during bonding. Therefore, the pad formation region and the semiconductor element formation region are separately provided in a semiconductor chip when viewed from the top side. However, since the semiconductor chip has been reduced in size and increased in degree of integration, disposition of the semiconductor element under a pad and a bump has been in demand. JP-A-2002-319587 discloses such technology, for example.

SUMMARY

According to a first aspect of the invention, there is provided a semiconductor device comprising:

a semiconductor layer including an element formation region and an isolation region provided around the element formation region;

an element formed in the element formation region;

an interlayer dielectric formed above the semiconductor layer;

an electrode pad formed above the interlayer dielectric;

a passivation layer formed above the electrode pad and having an opening which exposes at least part of the electrode pad; and a bump formed in the opening and having a rectangular planar shape having a short side and a long side, the bump at least partially covering the element when viewed from a top side, the semiconductor layer positioned within a specific range inward and outward from a line extending vertically downward from the short side of the bump being a forbidden region.

According to a second aspect of the invention, there is provided a semiconductor device comprising:

a semiconductor layer including an element formation region and an isolation region provided around the element formation region;

an element formed in the element formation region;

an interlayer dielectric formed above the semiconductor layer;

an electrode pad formed above the interlayer dielectric;

a passivation layer formed above the electrode pad and having an opening which exposes at least part of the electrode pad;

a bump formed in the opening and at least partially covering the element when viewed from a top side; and a lead wire formed on the bump and overlapping one side of the bump when viewed from a top side, the semiconductor layer positioned within a specific range inward and outward from a line extending vertically downward from the one side of the bump and a side opposite to the one side being a forbidden region in which the element formation region is not provided.

According to a third aspect of the invention, there is provided a semiconductor device comprising:

a semiconductor layer including an element formation region and an isolation region provided around the element formation region;

an element formed in the element formation region;

an interlayer dielectric formed above the semiconductor layer;

an electrode pad formed above the interlayer dielectric;

a passivation layer formed above the electrode pad and having an opening which exposes at least part of the electrode pad; and a bump formed in the opening and covering the element when viewed from a top side, the semiconductor layer positioned within a specific range inward and outward from a line extending vertically downward from an edge of the bump being a forbidden region.

DETAILED DESCRIPTION OF THE EMBODIMENT

Figure 1:
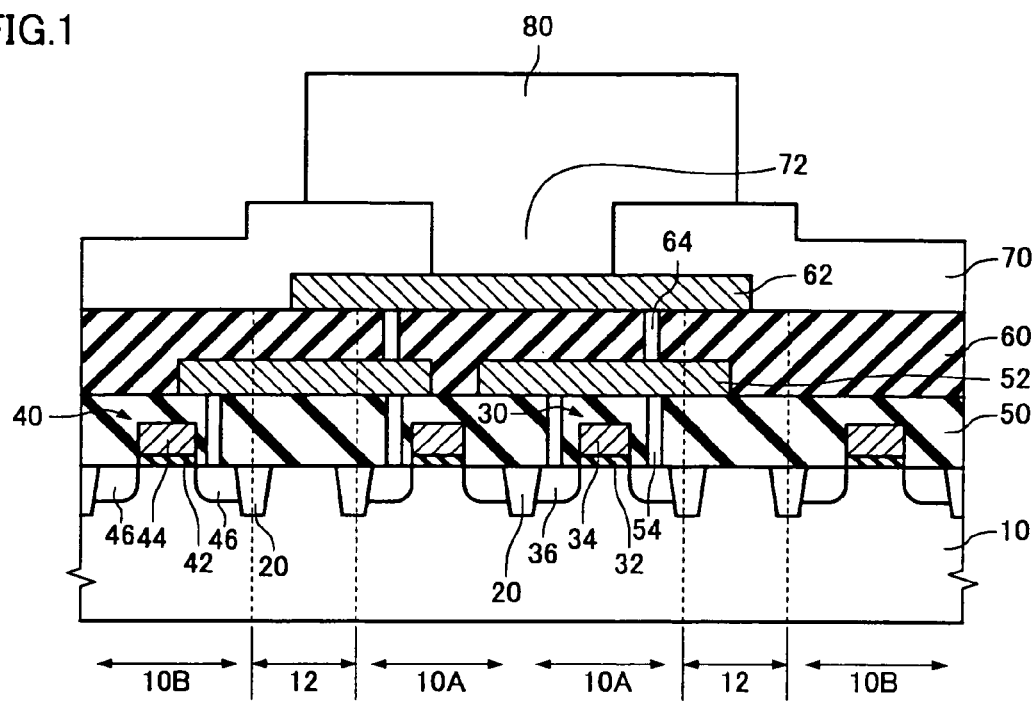
FIG. 1 is a view illustrative of a semiconductor device according to a first embodiment.

The invention may provide a highly reliable semiconductor device in which a semiconductor element can be formed under a bump.

(1) According to one embodiment of the invention, there is provided a semiconductor device comprising:

a semiconductor layer including an element formation region and an isolation region provided around the element formation region;

an element formed in the element formation region;

an interlayer dielectric formed above the semiconductor layer;

an electrode pad formed above the interlayer dielectric;

a passivation layer formed above the electrode pad and having an opening which exposes at least part of the electrode pad; and a bump formed in the opening and having a rectangular planar shape having a short side and a long side, the bump at least partially covering the element when viewed from a top side, the semiconductor layer positioned within a specific range inward and outward from a line extending vertically downward from the short side of the bump being a forbidden region.

The semiconductor device according to this embodiment includes the semiconductor layer including the element formation region and the isolation region provided around the element formation region, wherein the semiconductor positioned under the bump is the element formation region and the forbidden region is provided in a specific region positioned inward and outward from the short side of the bump. Stress tends to occur in a specific region positioned inward and outward from the short side of the bump. Therefore, cracks tend to occur in the interlayer dielectric disposed above the forbidden region. For example, when a semiconductor element such as a MOS transistor is formed in the forbidden region, the characteristics of the MOS transistor may deteriorate. In the semiconductor device according to this embodiment, the above-described problem is eliminated by providing the forbidden region in the above specific range. The semiconductor layer positioned under the bump is provided as the element formation region, and a semiconductor element is disposed under the bump at a position in which the semiconductor element can be formed without causing a problem. Specifically, a semiconductor device which can be scaled down and maintains reliability can be provided by disposing a semiconductor element under the bump at a position in which the reliability is not affected without disposing a semiconductor element at a position in which the reliability may be impaired.

In this embodiment, the statement "a specific layer B (hereinafter called "layer B") formed above a specific layer A (hereinafter called "layer A")" includes the case where the layer B is directly formed on the layer A and the case where the layer B is formed on the layer A through another layer.

The semiconductor device according to this embodiment may have the following features.

(2) In this semiconductor device, the forbidden region may be a range within 1.0 to 2.5 micrometers outward from a line extending vertically downward from the short side of the bump.

(3) In this semiconductor device, the forbidden region may be a range within 1.0 to 2.5 micrometers inward from a line extending vertically downward from the short side of the bump.

(4) According to one embodiment of the invention, there is provided a semiconductor device comprising:

a semiconductor layer including an element formation region and an isolation region provided around the element formation region;

an element formed in the element formation region;

an interlayer dielectric formed above the semiconductor layer;

an electrode pad formed above the interlayer dielectric;

a passivation layer formed above the electrode pad and having an opening which exposes at least part of the electrode pad;

a bump formed in the opening and at least partially covering the element when viewed from a top side; and a lead wire formed on the bump and overlapping one side of the bump when viewed from a top side, the semiconductor layer positioned within a specific range inward and outward from a line extending vertically downward from the one side of the bump and a side opposite to the one side being a forbidden region in which the element formation region is not provided.

In the semiconductor device according to this embodiment, the element formation region is provided under the bump, and the semiconductor layer within a specific range inside and outside the bump is provided as the forbidden region. Therefore, this embodiment has the same advantage as that of the above invention and can provide a semiconductor device which is scaled down and provided with improved reliability by disposing a semiconductor element under the bump at a position in which the reliability is not affected without disposing a semiconductor element at a position in which the reliability may be impaired.

The semiconductor device according to this embodiment may have the following features.

(5) In this semiconductor device, the forbidden region may be a range within 1.0 to 2.5 micrometers outward from a line extending vertically downward from the one side and the side opposite the one side of the bump.

(6) In this semiconductor device, the forbidden region may be a range within 1.0 to 2.5 micrometers inward from a line extending vertically downward from the one side and the side opposite the one side of the bump.

(7) According to one embodiment of the invention, there is provided a semiconductor device comprising:

a semiconductor layer including an element formation region and an isolation region provided around the element formation region;

an element formed in the element formation region;

an interlayer dielectric formed above the semiconductor layer;

an electrode pad formed above the interlayer dielectric;

a passivation layer formed above the electrode pad and having an opening which exposes at least part of the electrode pad; and a bump formed in the opening and covering the element when viewed from a top side, the semiconductor layer positioned within a specific range inward and outward from a line extending vertically downward from an edge of the bump being a forbidden region.

In the semiconductor device according to this embodiment, the element formation region is provided under the bump, and the semiconductor layer within a specific range inside and outside the bump is provided as the forbidden region. Therefore, this embodiment has the same advantage as that of the above invention and can provide a semiconductor device which is scaled down and provided with improved reliability by disposing a semiconductor element under the bump at a position in which the reliability is not affected without disposing a semiconductor element at a position in which the reliability may be impaired.

(8) In this semiconductor device, the forbidden region may be a range within 1.0 to 2.5 micrometers outward from a line extending vertically downward from the edge of the bump.

(9) In this semiconductor device, the forbidden region may be a range within 1.0 to 2.5 micrometers inward from a line extending vertically downward from the edge of the bump.

(10) In this semiconductor device, the element may be a transistor.

(11) In this semiconductor device, the forbidden region may be a forbidden region for a low-voltage-drive transistor.

(12) In this semiconductor device, a high-voltage transistor may be formed in the forbidden region.

Some embodiments of the invention will be described in detail below, with reference to the drawings.

1. First Embodiment

Figure 2:
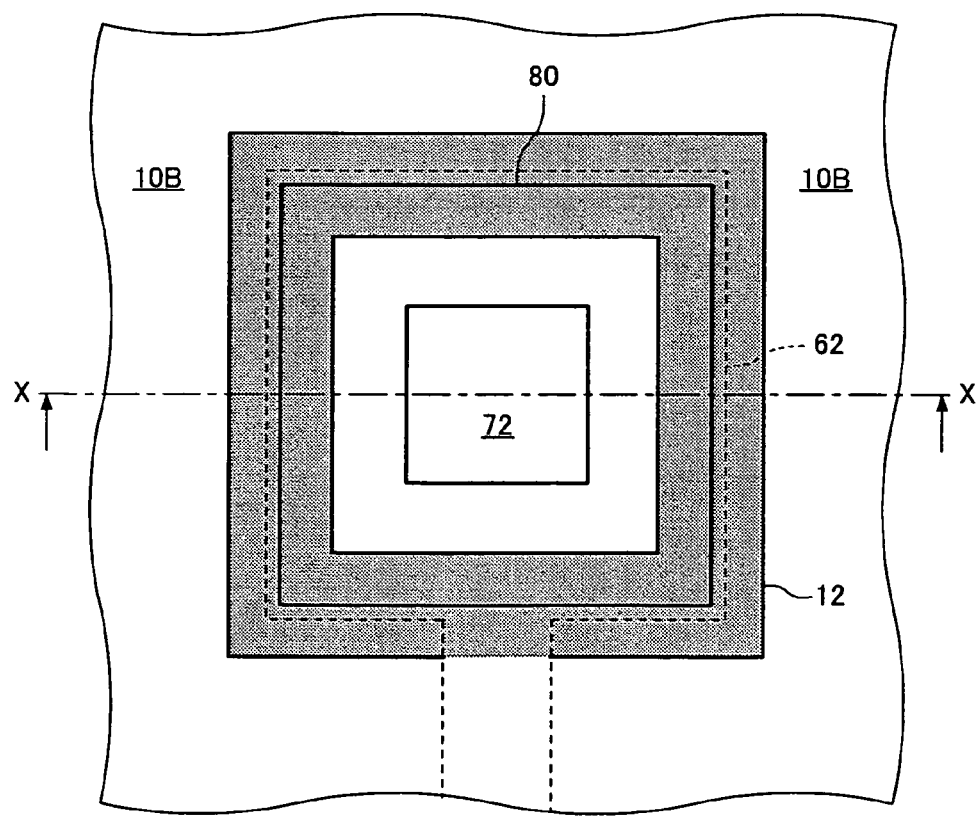
FIG. 2 is a view illustrative of the semiconductor device according to the first embodiment.

FIG. 1 is a cross-sectional view schematically showing a semiconductor device according to a first embodiment of the invention, and FIG. 2 is a plan view schematically showing the relationship between the shape of an electrode pad and a forbidden region in the semiconductor device according to the first embodiment. FIG. 1 shows the cross section along the line X-X shown in FIG. 2.

As shown in FIG. 1, the semiconductor device according to the first embodiment includes a semiconductor layer 10. As the semiconductor layer 10, a single crystal silicon substrate, a silicon on insulator (SOI) substrate in which a semiconductor layer is formed on an insulating layer, the semiconductor layer being a silicon layer, a germanium layer, or a silicon germanium layer, or the like may be used.

An isolation insulating layer 20 is formed in the semiconductor layer 10. The isolation insulating layer 20 may be formed by a shallow trench isolation (STI) method, a local oxidation of silicon (LOCOS) method, or a semi-recessed LOCOS method. FIG. 1 shows the isolation insulating layer 20 formed by the STI method. An element formation region 10A in which an element is formed and a forbidden region 12 are defined by forming the isolation insulating layer 20. The element formation region 10A is a region provided under a bump, as described later. The forbidden region 12 is the gray area shown in FIG. 1, which is the semiconductor layer 10 in a specific range inside and outside the edge of the bump. The forbidden region 12 is also described later. In the semiconductor device according to the first embodiment, an element formation region 10B is provided outside the forbidden region 12.

Figure 3:
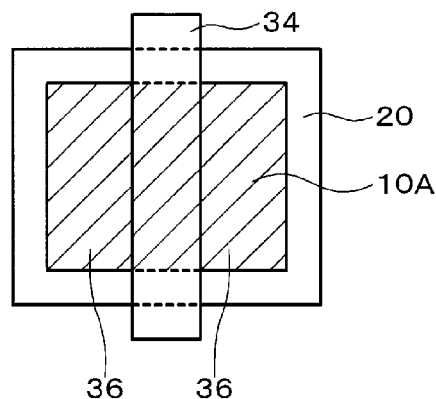
FIG. 3 is a view illustrative of the semiconductor device according to the first embodiment.

A low-voltage-drive metal insulator semiconductor (MIS) transistor 30 in which an insulating layer is not formed in an offset region is formed in the element formation region 10A. An MIS transistor 40 is formed in the element formation region 10B in the same manner as in the element formation region 10A. The MIS transistor 30 includes a gate insulating layer 32, a gate electrode 34 formed on the gate insulating layer 32, and impurity regions 36 formed in the semiconductor layer 10. The impurity region 36 serves as a source region or a drain region. The MIS transistor 40 is a low-voltage-drive transistor which has a structure similar to that of the MIS transistor 30 and includes a gate insulating layer 42, a gate electrode 44, and impurity regions 46 and in which an insulating layer is not formed in an offset region. The element formation region 10A according to the first embodiment refers to a region enclosed by the isolation insulating layer 20 (region indicated by slanted lines) when viewed from the top side, as shown in FIG. 3. This also applies to the element formation region 10B.

An interlayer dielectric 50 which covers the MIS transistors 30 and 40 and an interlayer dielectric 60 are formed above the MIS transistors 30 and 40 in that order. The interlayer dielectric 50 and the interlayer dielectric 60 may be formed using a known material. An interconnect layer 52 having a specific pattern is formed on the interlayer dielectric 50. The interconnect layer 52 and the impurity region 36 of the MIS transistor 30 are electrically connected through a contact layer 54.

An electrode pad 62 is formed on the interlayer dielectric 60. The electrode pad 62 may be electrically connected with the interconnect layer 52 through a contact layer 64. The electrode pad 62 may be formed of a metal such as aluminum or copper.

As shown in FIG. 1, the semiconductor device according to the first embodiment further includes a passivation layer 70. An opening 72 which exposes at least part of the electrode pad 62 is formed in the passivation layer 70. As shown in FIGS. 1 and 2, the opening 72 may be formed to expose only the center region of the electrode pad 62. Specifically, the passivation layer 70 may be formed to cover the edge portion of the electrode pad 62. The passivation layer 70 may be formed of $SiO_2$, SiN, a polyimide resin, or the like. In the semiconductor device according to the first embodiment, the term "electrode pad" refers to a region which includes the region in which the opening 72 is formed and has a width greater than that of the interconnect section.

In the semiconductor device according to the first embodiment, a bump 80 is formed at least in the opening 72. Specifically, the bump 80 is formed on the exposed surface of the electrode pad 62. In the semiconductor device according to the first embodiment shown in FIG. 1, the bump 80 is also formed on the passivation layer 70. The bump 80 may include one or more layers and may be formed of a metal such as gold, nickel, or copper. The external shape of the bump 80 is not particularly limited. The external shape of the bump 80 may be a quadrilateral (including square and rectangle) or a circle. The external shape of the bump 80 may cover less area than that of the electrode pad 62. In this case, the bump 80 may be formed only in the area in which the bump 80 overlaps the electrode pad 62.

A barrier layer (not shown) may be formed in the lowermost layer of the bump 80. The barrier layer prevents diffusion between the electrode pad 62 and the bump 80. The barrier layer may include one or more layers. The barrier layer may be formed by sputtering, for example. The barrier layer may have a function of increasing the adhesion between the electrode pad 62 and the bump 80. The barrier layer may include a titanium tungsten (TiW) layer. When the barrier layer includes two or more layers, the outermost surface of the barrier layer may be an electroplating feed metal layer (e.g. Au layer) for depositing the bump 80.

The forbidden region 12 is described below. As described above, the forbidden region 12 refers to the region of the semiconductor layer 10 positioned within a specific range inside and outside the edge of the bump 80. An element formation region cannot be disposed in the forbidden region 12.

The forbidden region 12 may be the range within 2.0 to 3.0 micrometers outward (in the direction opposite to the opening 72) from the edge of the bump 80 and within 2.0 to 3.0 micrometers inward (in the direction toward the opening 72) from the edge of the bump 80. The range of the forbidden region 12 is specified as described above for the following reasons.

Stress occurs near the edge of the bump 80 during the process in which the bump 80 is formed. After the bump 80 has been formed, stress continuously occurs near the edge of the bump 80 due to internal stress of the bump 80. The stress may cause cracks to occur in the interlayer dielectrics 50 and 60 from the position at which the stress occurs. Such cracks may reach the lowermost layer of the interlayer dielectric, whereby the characteristics of the semiconductor element formed in such a region may be changed. For example, when a MIS transistor is formed in such a region, a gate insulating layer deteriorates, whereby a leakage current flows (this problem is discussed later in a second embodiment). In the semiconductor device according to the first embodiment, the forbidden region 12 is provided in the range near the edge of the bump 80 in order to prevent the above-described problem.

In the semiconductor device according to the first embodiment, the semiconductor layer positioned under the bump 80 is the element formation region 10A, and the forbidden region 12 is provided in a specific region positioned outward from the edge of the bump 80. Stress tends to occur in a specific region positioned outward from the edge of the bump 80. Therefore, cracks tend to occur in the interlayer dielectrics 50 and 60 disposed above the forbidden region 12. For example, when a semiconductor element such as a MIS transistor is formed in the forbidden region 12, the characteristics of the MIS transistor may deteriorate. In the semiconductor device according to the first embodiment, the above-described problem is eliminated by providing the forbidden region 12 in the above specific range. The semiconductor layer 10 positioned under the bump 80 is provided as the element formation region 10A, and the semiconductor element is disposed the element formation region 10A. Specifically, the first embodiment can provide a semiconductor device which can be scaled down and maintains reliability by disposing the semiconductor element under the bump 80 at a position in which the reliability is not affected without disposing the semiconductor element at a position in which the reliability may be impaired.

A conductive layer forming the gate electrode 34 may be used as an interconnect for connecting the semiconductor element with another element such as the MIS transistor 40. The portion of the conductive layer used as the interconnect may be formed in the forbidden region 12.

2. Second Embodiment

Figure 4:
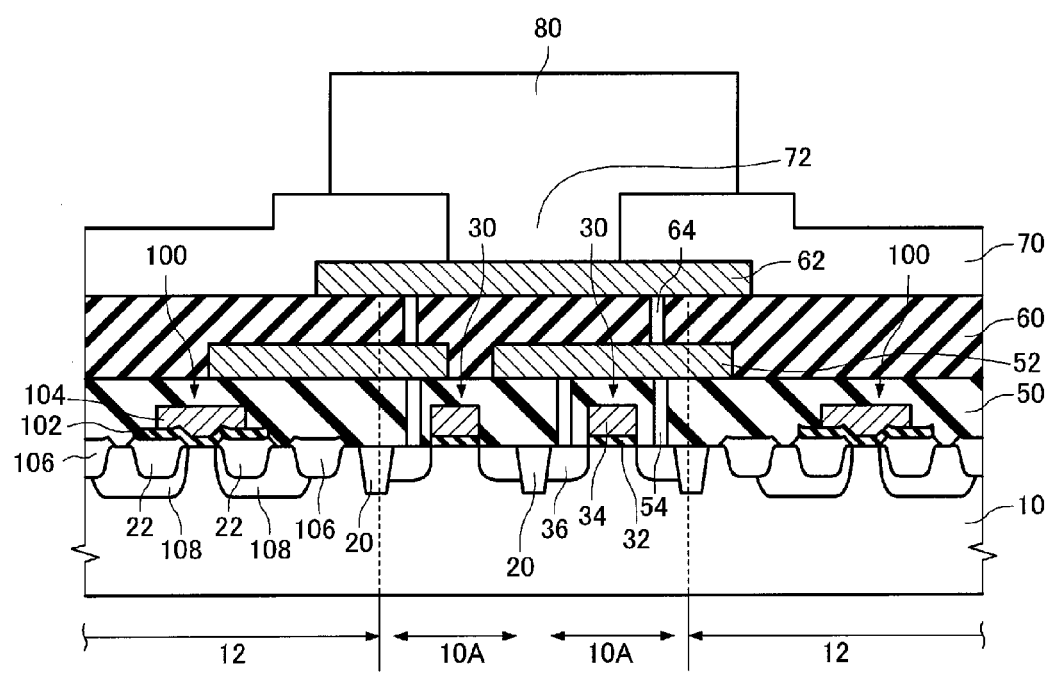
FIG. 4 is a view illustrative of a semiconductor device according to a second embodiment.

A second embodiment of the invention is described below with reference to FIG. 4. FIG. 4 is a cross-sectional view schematically showing a semiconductor device according to the second embodiment. The semiconductor device according to the second embodiment differs from the semiconductor device according to the first embodiment in that a semiconductor element is formed in the forbidden region 12. The following description merely illustrates the difference from the semiconductor device according to the first embodiment.

As shown in FIG. 4, the semiconductor device according to the second embodiment includes the element formation region 10A and the forbidden region 12 provided around the element formation region 10A. In the semiconductor device according to the second embodiment, the element formation region 10B is provided outside the forbidden region 12 in the same manner as in the semiconductor device according to the first embodiment, although not shown in FIG. 4.

In the semiconductor device according to the second embodiment, a high-voltage MOS transistor is formed in the forbidden region 12. In more detail, a MOS transistor 100 having a LOCOS offset structure is formed in the forbidden region 12. The MOS transistor 100 includes an offset insulating layer 22 which is formed in the semiconductor layer 10 and reduces an electric field, a gate insulating layer 102 formed on the semiconductor layer 10, a gate electrode 104 formed on part of the offset insulating layer 22 and the gate insulating layer 102, and impurity regions 106 formed in the semiconductor layer outside the gate electrode 104 and serving as either a source region or a drain region. An offset impurity region 108 of the same conductivity type as that of the impurity region 106 and having an impurity concentration lower than that of the impurity region 106 is formed under the offset insulating layer 22. FIG. 4 illustrates the case where the offset insulating layer 22 is formed by the semi-recessed LOCOS method. Note that the offset insulating layer 22 may be formed by the STI method, the LOCOS method, or the like.

In the semiconductor device according to the second embodiment, some of the constituent elements of the MOS transistor 100 are formed in the semiconductor layer 10 in the forbidden region 12. In the MOS transistor 100, the end of the gate electrode 104 is formed on the offset insulating layer 22. Specifically, a structure in which the end of the gate electrode 104 (first conductive layer) is disposed on the semiconductor layer 10 through a thin insulating layer is not formed in the forbidden region 12. A problem which may occur when the MIS transistor 30 having the structure formed in the element formation region is formed in the forbidden region 12 is described below. The MIS transistor 30 has a structure in which the end of the gate electrode 34 is formed on the semiconductor layer 10, differing from the MOS transistor 100. Therefore, stress tends to occur in the semiconductor layer 10 at a position at which the end of the gate electrode 34 is positioned. As described in the first embodiment, cracks tend to occur in the interlayer dielectrics 50 and 60 positioned over the forbidden region 12, whereby the film tends to deteriorate. This effect may be exerted on the end of the gate electrode 34 at which stress occurs, whereby the gate insulating layer 32 may deteriorate. This may cause a leakage current to flow through the MIS transistor 30.

However, in the semiconductor device according to the second embodiment, since the end of the gate electrode 104 is disposed on the offset insulating layer 22 in the forbidden region 12, the above-described stress does not occur in the semiconductor layer 10, whereby deterioration of the gate insulating layer 102 can be prevented. This allows a semiconductor element having a specific structure to be disposed in the forbidden region 12 in addition to the element formation region 10A provided under the bump 80, whereby the semiconductor chip can be further scaled down. This increases the number of semiconductor chips formed on one wafer, whereby the manufacturing cost can be reduced.

FIG. 4 illustrates the case where the MOS transistor 100 is formed in the forbidden region 12. Note that the second embodiment is not limited thereto. The second embodiment also includes the case where part of the configuration of the MOS transistor 100 is formed in the forbidden region 12. In this case, a MOS transistor having a one-sided offset structure may be formed.

3. Modification

Figure 5:
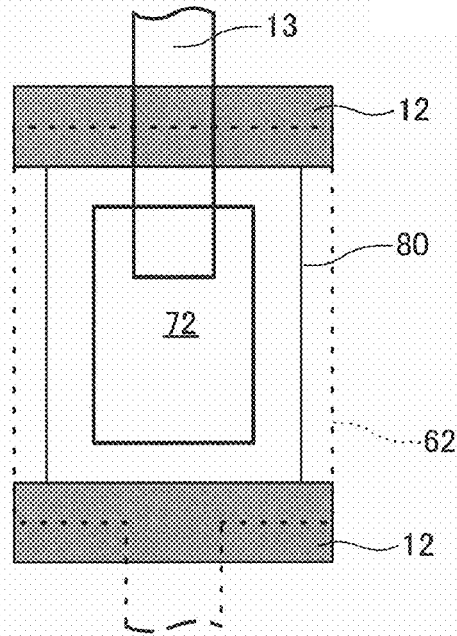
FIG. 5 is a view illustrative of a semiconductor device according to the first and second embodiments.

A modification of the semiconductor devices according to the first embodiment and the second embodiment is described below. This modification is characterized in that the bump 80 has a rectangular planar shape having a short side and a long side. FIG. 5 is a plan view schematically showing the positional relationship among the bump 80, the electrode pad 62, and the forbidden region 12. The following description merely illustrates the difference from the semiconductor devices according to the first embodiment and the second embodiment.

In the semiconductor device according to this modification, the bump 80 is formed in the opening 72 on the electrode pad 62, as shown in FIGS. 1 and 4. The opening 72 has a rectangular shape, and the bump 80 formed in the opening 72 also has a rectangular shape. In this modification, the forbidden region 12 is provided in the semiconductor layer 10 positioned in a specific region outward from the edge of the short side of the bump 80 and inside and outside the edge of the electrode pad 62. This configuration has the following advantage when mounting the semiconductor device by the COF technology provided that the extension direction of a connection line 13 (lead wire) formed on a film is the direction along the long side of the bump 80. The bump 80 is pulled in the extension direction of the connection line, whereby stress occurs on the short side of the bump 80. Therefore, cracks tend to occur in the interlayer dielectrics 50 and 60 on the edge on the short side of the bump 80, as described above. This modification reliably prevents the semiconductor element from being formed at a position in which the reliability is decreased by providing the forbidden region 12 on the short side of the bump 80. Moreover, since the forbidden region 12 is not provided in the semiconductor layer positioned under the long side of the bump 80, the semiconductor element can be formed on the semiconductor layer positioned under the long side of the bump 80, whereby a scaled-down semiconductor device can be provided.

Figure 6:
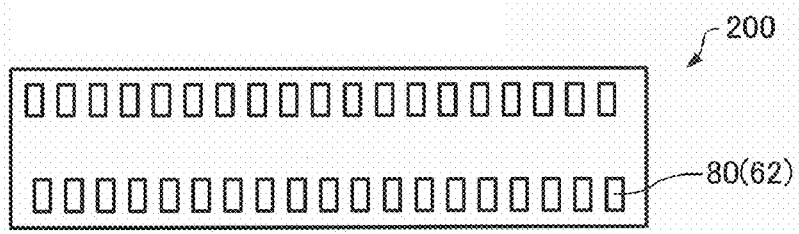
FIG. 6 is a view illustrative of the semiconductor device according to the first and second embodiments.

In particular, in a semiconductor chip 200 which is scaled down as shown in FIG. 6, a structure may be required in which the opening 72 and the bump 80 are formed in a rectangular shape to provide a number of openings 72. This modification can provide a semiconductor device which is scaled down and provided with improved reliability by providing the forbidden region 12 in an appropriate region in a semiconductor device having such rectangular bumps 80.

The above embodiments illustrate the case where two interlayer dielectrics 50 and 60 are provided and one interconnect layer 52 is provided between the interlayer dielectrics 50 and 60. Note that the above embodiments are not limited thereto. A structure may also be employed in which three or more interlayer dielectrics are stacked and interconnect layers in a number corresponding to the number of interlayer dielectrics are provided. In the MIS transistors 30, 40, and 100, a sidewall insulating layer may be formed on the side surface of each of the gate electrodes 34, 44, and 104 (not shown in FIGS. 1 and 6). A silicide layer may be formed on the upper surfaces of the gate electrodes 34, 44, and 104 and the impurity regions 36, 46, and 106.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device comprising:
   a semiconductor layer including an element formation region, a first isolation region and a second isolation region which is away from the first isolation region;
   a first element formed in the element formation region;
   an interlayer dielectric layer formed above the semiconductor layer;
   an electrode pad formed above the interlayer dielectric layer;
   a passivation layer formed above the electrode pad and having an opening which exposes at least a part of the electrode pad; and
   a bump formed in the opening and covering at least a part of the first element when viewed from a top side, the bump having a rectangular planar shape having a short side and a long side when viewed from the top side,
   the first isolation region being formed in a first region, the first region including a first specific distance outward from a first line located directly below a first edge of the short side of the bump,
   the second isolation region completely overlapping with the first line,
   the element formation region being not formed between the first isolation region and the second isolation region.

2. The semiconductor device as defined in claim 1, the first specific distance being within 1.0 to 2.5 micrometers outward from the first line.

3. The semiconductor device as defined in claim 1, the first element being a transistor.

4. The semiconductor device as defined in claim 1, further comprising:
   a second element formed in the second element formation region,
   the bump covering the second element when viewed from a top side.

5. The semiconductor device as defined in claim 4, the second element being a second transistor.

\* \* \* \* \*